(12) United States Patent
Pichon et al.

(10) Patent No.: US 11,811,395 B2
(45) Date of Patent: Nov. 7, 2023

(54) THYRISTOR CONTROL DEVICE

(71) Applicant: STMicroelectronics (Tours) SAS, Tours (FR)

(72) Inventors: Romain Pichon, Reugny (FR); Yannick Hague, Mettray (FR)

(73) Assignee: STMicroelectronics (Tours) SAS, Tours (FR)

( * ) Notice: Subject to any disclaimer, the term of this patent is extended or adjusted under 35 U.S.C. 154(b) by 12 days.

(21) Appl. No.: 17/466,604

(22) Filed: Sep. 3, 2021

(65) Prior Publication Data
US 2022/0077850 A1 Mar. 10, 2022

(30) Foreign Application Priority Data

Sep. 7, 2020 (FR) ..................................... 2009057

(51) Int. Cl.
| | | |
|---|---|---|
| *H03K 17/13* | (2006.01) | |
| *H03K 17/76* | (2006.01) | |
| *H03K 17/30* | (2006.01) | |

(52) U.S. Cl.
CPC .......... *H03K 17/136* (2013.01); *H03K 17/76* (2013.01); *H03K 17/305* (2013.01)

(58) Field of Classification Search
CPC ...... H02M 1/00; H02M 1/0085; H02M 1/081; H02M 7/00; H02M 7/062; H02M 7/125; H02M 7/219; H03K 17/00; H03K 17/136; H03K 17/305; H03K 17/72; H03K 17/725; H03K 17/74; H03K 17/76

USPC ......................................................... 327/452
See application file for complete search history.

(56) References Cited

U.S. PATENT DOCUMENTS

| | | | |
|---|---|---|---|
| 3,735,158 A * | 5/1973 | McDonald | ........... H03K 17/725 |
| | | | 323/237 |
| 4,158,121 A | 6/1979 | Casagrande | |
| 2016/0111969 A1 * | 4/2016 | Gonthier | ............... H02M 7/155 |
| | | | 363/126 |

FOREIGN PATENT DOCUMENTS

| | | |
|---|---|---|
| FR | 2735296 A1 | 12/1996 |
| FR | 2746981 A1 | 10/1997 |

OTHER PUBLICATIONS

INPI Search Report and Written Opinion for FR Appl. No. 2009057 dated May 10, 2021 (11 pages).

\* cited by examiner

*Primary Examiner* — Jeffery S Zweizig
(74) *Attorney, Agent, or Firm* — CROWE & DUNLEVY

(57) ABSTRACT

A control device includes a triac and a first diode that is series-connected between the triac and a first terminal of the device that is configured to be connected to a cathode gate of a thyristor. A second terminal of the control device is configured to be connected to an anode of the thyristor. The triac has a gate connected to a third terminal of the device that is configured to receive a control signal. The thyristor is a component part of one or more of a rectifying bridge circuit, an in-rush current limiting circuit or a solid-state relay circuit.

17 Claims, 2 Drawing Sheets

THYRISTOR CONTROL DEVICE

PRIORITY CLAIM

This application claims the priority benefit of French Application for Patent No. 2009057, filed on Sep. 7, 2020, the content of which is hereby incorporated by reference in its entirety to the maximum extent allowable by law.

TECHNICAL FIELD

The present disclosure generally relates to electronic devices and, more particularly, to an electronic thyristor control device.

BACKGROUND

A thyristor, also called silicon controlled rectifier or SCR, is formed of four semiconductor layers, generally made of silicon, alternately N-type doped and P-type doped.

More particularly, the thyristor comprises a stack of alternating P-type doped and N-type doped layer, where a first P-type doped layer forms the thyristor anode, a first N-type doped layer forms the thyristor cathode, a second N-type doped layer is in contact with the first P-type doped layer, and a second P-type doped layer is in contact with the first N-type doped layer. Where the thyristor gate corresponds to the second N-type doped layer, the thyristor is called an anode-gate thyristor. Where the thyristor gate corresponds to the second P-type doped layer, the thyristor is called a cathode-gate thyristor.

Cathode-gate thyristors are used in many electronic devices. For power efficiency reasons or, in other words, to limit the power consumed by such a thyristor, it is desired for the triggering, that is, the controlled switching to the on state, of the cathode-gate thyristor to occur in its first quadrant. In the first quadrant, the thyristor is switched to the on state by the delivery of a positive current to its gate, which current flows from the gate to the cathode, while the voltage $V_{AK}$ between the anode and the cathode of the thyristor is positive and greater than a thyristor threshold voltage, voltage $V_{AK}$ being referenced with respect to the thyristor cathode.

Electronic thyristor control devices configured to deliver a control signal or current to the gate of a thyristor are known. Such control devices are configured to receive a first control signal and to generate a second control signal delivered to the thyristor gate. In other words, the devices are configured to shape a control signal delivered to the thyristor gate. Such control circuits are also called drivers.

Known devices for controlling a thyristor, and in particular a cathode-gate thyristor, suffer from various disadvantages.

There is a need to overcome all or part of the disadvantages of known devices for controlling a thyristor, particularly a cathode-gate thyristor.

SUMMARY

An embodiment overcomes all or part of the disadvantages of known thyristor control devices.

One embodiment provides a control device comprising a triac and a first diode series-connected between the triac and a first terminal of the control device that is configured to be connected to a cathode gate of a thyristor, and a second terminal of the control device that is configured to be connected to an anode of the thyristor, the triac having a gate connected to a third terminal of the control device that is configured to receive a control signal.

According to an embodiment, the first diode has a cathode coupled to the first terminal of the device.

According to an embodiment, the cathode of the first diode is connected to the first terminal of the control device, the control device further comprising: a fourth terminal configured to be connected to gate of a cathode gated SCR; and a second diode, preferably identical to the first diode, series-connected between the triac and the fourth terminal, the cathode of the second diode being connected to the fourth terminal of the control device and the second terminal of the control device being further configured to be connected to an anode of said other thyristor.

According to an embodiment, the device further comprises a circuit configured to deliver the control signal to the third terminal of the device, the circuit being connected to the second terminal of the device and being configured to be electrically powered with a power supply potential, preferably positive, referenced to the second terminal of the control device.

Another embodiment provides an integrated circuit comprising the above defined control device.

Another embodiment provides a rectifying bridge comprising: a first branch and a second branch connected in parallel between a first internal node of the rectifying bridge coupled, preferably connected, to a first output node of the rectifying bridge, and a second internal node of the rectifying bridge; a resistor and a thyristor connected in parallel between the second internal node and a second output node of the rectifying bridge, the anode of the thyristor being connected to the second output node; and the above defined control device, the second terminal of the control device being connected to the second output node and the first terminal of the device being connected to the cathode gate of the thyristor.

According to an embodiment, the rectifying bridge further comprises a circuit configured to deliver a control signal to the third terminal of the control device, the circuit being connected to the second output node of the rectifying bridge and being configured to be electrically power with a power supply potential, preferably positive, referenced to the second output node of the rectifying bridge.

Another embodiment provides a rectifying bridge comprising: the above defined control device, the second terminal of the control device being connected to a first internal node of the rectifying bridge coupled, preferably connected, to a first output node of the rectifying bridge; a first thyristor comprising a cathode connected to a first input node of the rectifying bridge, an anode connected to the first internal node, and a cathode gate connected to the first terminal of the control device; and a second thyristor comprising a cathode connected to a second input node of the rectifying bridge, an anode connected to the first internal node, and a cathode gate connected to the fourth terminal of the control device.

According to an embodiment, the rectifying bridge further comprises a circuit configured to deliver a control signal to the third terminal of the control device, the circuit being connected to the first internal node of the rectifying bridge and being configured to be electrically power with a power supply potential, preferably positive, referenced to the first internal node of the rectifying bridge.

According to an embodiment, the rectifying bridge further comprises: a diode comprising a cathode connected to a second internal node of the rectifying bridge coupled, preferably connected, to a second output node of the rectifying bridge, and an anode connected to the first input node of the rectifying bridge; another diode comprising a cathode connected to the second internal node of the rectifying bridge and an anode connected to the second input node of the rectifying bridge.

Another embodiment provides an integrated circuit comprising the above defined rectifying bridge.

Another embodiment provides a solid state relay comprising: a first thyristor and a second thyristor connected in antiparallel between a first terminal of the solid state relay and a second terminal of the solid state relay, an anode of the first thyristor being connected to the first terminal of the solid state relay; and the above defined control device, the first terminal of the control device being connected to a cathode gate of the first thyristor and the second terminal of the control device being connected to the first terminal of the relay.

According to an embodiment, the solid state relay further comprises a circuit configured to deliver a control signal to the third terminal of the control device, the circuit being connected to the first terminal of the solid state relay and being configured to be electrically powered with a power supply potential, preferably positive, referenced to the first terminal of the solid state relay.

According to an embodiment, the control circuit is further configured to deliver another control signal to the gate of the second thyristor, preferably, a terminal of the control circuit configured to deliver said other control signal being connected to the gate of the second thyristor or being coupled to the gate of the second thyristor by a diode.

Another embodiment provides an integrated circuit comprising the above defined solid state relay.

BRIEF DESCRIPTION OF THE DRAWINGS

The foregoing features and advantages, as well as others, will be described in detail in the following description of specific embodiments given by way of illustration and not limitation with reference to the accompanying drawings, in which.

DETAILED DESCRIPTION

Like features have been designated by like references in the various figures. In particular, the structural and/or functional features that are common among the various embodiments may have the same references and may dispose identical structural, dimensional and material properties.

For the sake of clarity, only the steps and elements that are useful for an understanding of the embodiments described herein have been illustrated and described in detail. In particular, the various current electronic devices comprising at least one thyristor, and more particularly at least one cathode-gate thyristor, have not all been described, the described embodiments and variants of control circuits being compatible with such current electronic devices.

Unless indicated otherwise, when reference is made to two elements connected together, this signifies a direct connection without any intermediate elements other than conductors, and when reference is made to two elements coupled together, this signifies that these two elements can be connected or they can be coupled via one or more other elements.

In the following disclosure, unless indicated otherwise, when reference is made to absolute positional qualifiers, such as the terms "front", "back", "top", "bottom", "left", "right", etc., or to relative positional qualifiers, such as the terms "above", "below", "higher", "lower", etc., or to qualifiers of orientation, such as "horizontal", "vertical", etc., reference is made to the orientation shown in the figures.

Unless specified otherwise, the expressions "around", "approximately", "substantially" and "in the order of" signify within 10%, and preferably within 5%.

Figure 1:
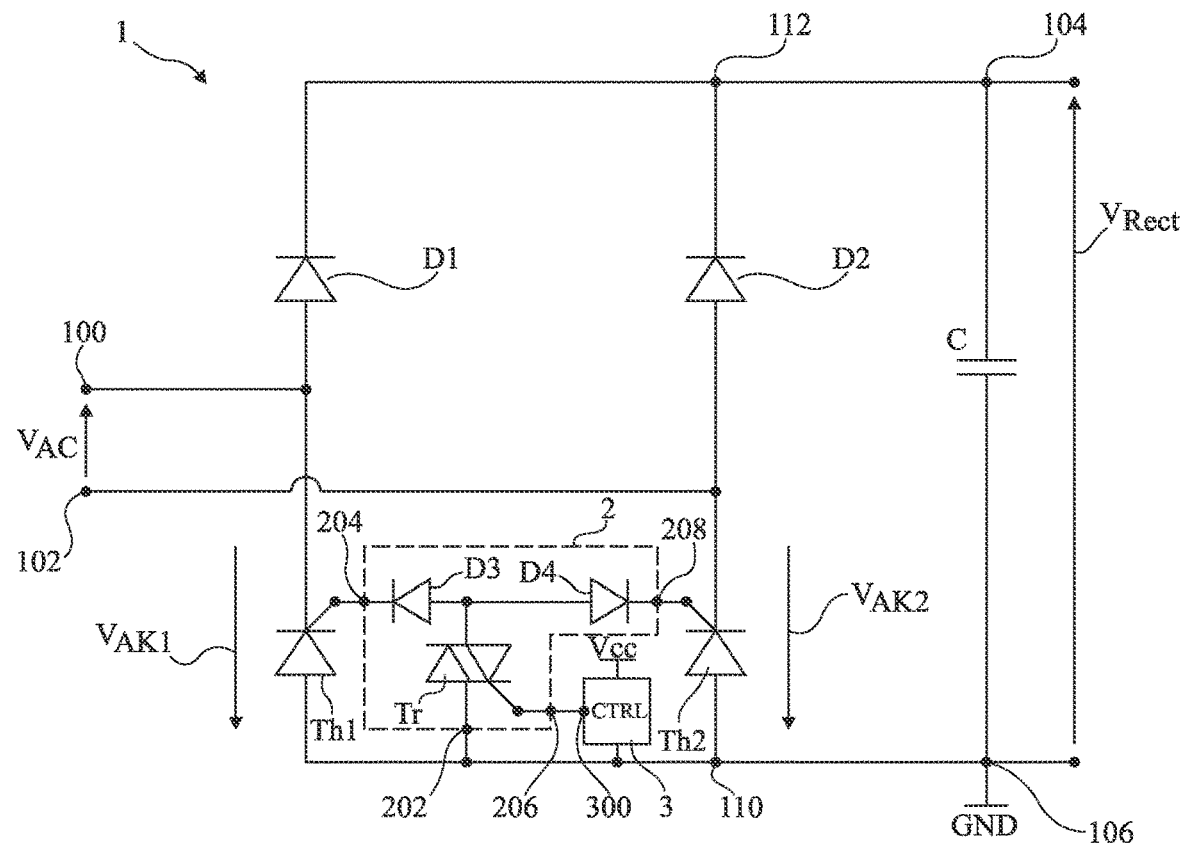
FIG. 1 shows, in the form of a circuit, an embodiment of a voltage rectifying bridge comprising a thyristor control device according to an embodiment.

FIG. 1 shows, in the form of a circuit, an embodiment of a voltage rectifying bridge 1 comprising a thyristor control device 2 according to an embodiment.

Rectifying bridge 1 comprises two input nodes 100 and 102. Rectifying bridge 1 further comprises two output nodes 104 and 106. Bridge 1 also comprises two internal nodes 110 and 112 coupled to respective nodes 106 and 104. More particularly, in the present example, nodes 110 and 112 are directly connected to respective nodes 106 and 104 or, in other words, node 110 is the same as node 106 and node 112 is the same as node 104.

Rectifying bridge 1 comprises a cathode-gate thyristor Th1, connected between nodes 100 and 110. More particularly, the anode of thyristor Th1 is connected to node 110 and the cathode of thyristor Th1 is connected to node 100.

Rectifying bridge 1 further comprises a cathode-gate thyristor Th2, connected between nodes 102 and 110. More particularly, the anode of thyristor Th2 is connected to node 110 and the cathode of thyristor Th2 is connected to node 102.

Thyristors Th1 and Th2 form a half-bridge of rectifying bridge 1, and more particularly a lower half-bridge of bridge 1.

In the present example, rectifying bridge 1 further comprises a diode D1 and a diode D2.

Diode D1 is connected between nodes 100 and 112. More particularly, the anode of diode D1 is connected to node 100 and the cathode of diode D1 is connected to node 112. Diode D1 is thus series-connected to thyristor Th1, between nodes 110 and 112. Diode D1 and thyristor Th1 belong to a same first branch of rectifying bridge 1 coupling nodes 110 and 112 to each other.

Diode D2 is connected between nodes 102 and 112. More particularly, the anode of diode D2 is connected to node 102 and the cathode of diode D2 is connected to node 112. Diode D2 is thus series-connected to thyristor Th2, between nodes 110 and 112. Diode D2 and thyristor Th2 belong to a same second branch of rectifying bridge 1 coupling nodes 110 and 112 to each other.

Diodes D1 and D2 form another half-bridge of rectifying bridge 1, and more particularly an upper half-bridge of bridge 1.

Rectifying bridge 1 is configured to rectify an AC voltage $V_{AC}$ applied between input nodes 100 and 102. Rectifying bridge 1 is configured to deliver a rectified voltage $V_{Rect}$ between its output nodes 104 and 106.

In practice, the two output nodes 104 and 106 are connected to two power supply terminals of an electronic device. Node 106 is then at a reference potential GND of the electronic device powered with voltage $V_{Rect}$.

A capacitor C is preferably connected between nodes 104 and 106 of rectifying bridge 1. Capacitor C may form part of rectifying bridge 1 or be external to rectifying bridge 1.

Device 2 is the control device of thyristor Th1, that is, it is configured to control thyristor Th1. More exactly, device 2 is configured to receive a control signal, and to generate another control signal from the received control signal, the control signal generated by device 2 being supplied to the cathode gate of thyristor Th1. In other words, device 2 is a driver of thyristor Th1.

Device 2 comprises a terminal 202 configured to be connected to the anode of thyristor Th1, terminal 202 being connected to the anode of thyristor Th1 in FIG. 1. Device 2 comprises a terminal 204 configured to be connected to the cathode gate of thyristor Th1 in FIG. 1. Device 2 comprises a terminal 206 configured to receive a control signal.

Device 2 comprises a triac Tr and a diode D3 series-connected with the triac Tr between terminals 204 and 202 of device 2.

Diode D3 is configured to prevent the flowing of a positive current from terminal 202 to terminal 204 when diode D3 is reverse biased, that is, when its anode potential is smaller than its cathode potential. In addition, the diode D3 is configured to allow a positive current to flow from terminal 202 to terminal 204 when it is forward biased, and to prevent the flowing of a positive current from terminal 204 to terminal 202. In other words, diode D3 has its cathode coupled to terminal 204 and its anode coupled to terminal 202.

More particularly, in this embodiment, the cathode of diode D3 is connected to terminal 204 and the anode of diode D3 is connected to a first conduction terminal of triac Tr, a second conduction terminal of triac Tr being connected to terminal 202. Further, the gate of triac Tr is connected to terminal 206 of device 2.

In this embodiment, device 2 is also the control device of thyristor Th2, that is, it is also configured to control thyristor Th2. More exactly, device 2 is configured to deliver a control signal to the cathode gate of thyristor Th2, the control signal being then generated by device 2 from the control signal received on its terminal 206. In other words, device 2 is the driver of thyristor Th2.

Device 2 then comprises an additional terminal 208 configured to be connected to the cathode gate of thyristor Th2, terminal 208 being connected to the cathode gate of thyristor Th2 in FIG. 1. Device 2 further comprises a diode D4, preferably identical to diode D3. Diode D4 is configured to prevent the flowing of a positive current from terminal 202 to terminal 208 when diode D4 is reverse-biased. In addition, the diode D4 is configured to allow a positive current to flow from terminal 202 to terminal 208 when it is forward biased, and to prevent the flowing of a positive current from terminal 208 to terminal 202. In other words, diode D4 has its cathode coupled to terminal 208, and its anode coupled to terminal 202.

More particularly, in this embodiment, diode D4 is series-connected with triac Tr. The cathode of diode D4 is then connected to terminal 208 and the anode of diode D4 is connected to the first conduction terminal of triac Tr.

In FIG. 1, the terminal 206 of device 2 is connected to a terminal 300 of a control circuit 3 (block CTRL). Circuit 3 is, for example, a microcontroller, terminal 300 being an output terminal of the microcontroller. Circuit 3 is configured to deliver a control signal to terminal 206 of device 2.

Circuit 3 is connected to terminal 202 of device 2, that is, to the anode of thyristor Th1. Indeed, circuit 3 is configured to be electrically powered with a positive power supply potential Vcc referenced with respect to the potential of terminal 202. Thus, circuit 3 is connected to a node of application of potential Vcc. As an example, potential Vcc is obtained from voltage $V_{Rect}$ with a voltage conversion circuit such that, for example, a buck voltage converter or a capacitive voltage converter, the voltage conversion circuit having a terminal coupled to terminal 202. It will be noted that the buck converted works if the complete bridge has started, and this is applicable if there is another path with a resistor (thermistor) to loop line-neutral when Vcc is still not available. Otherwise, an external auxiliary power supply is directly connected line to neutral.

Circuit 3 may form part of device 2 or be external to device 2. More generally, circuit 3 may form part of rectifying bridge 1 or be external to rectifying bridge 1.

In operation, when voltage $V_{AC}$ is such that the potential of node 100 is greater than that of node 102, diodes D1 and D2 are respectively on and off. Further, the voltage $V_{AK2}$ between the anode and the cathode of thyristor Th2 is positive and the voltage $V_{AK1}$ between the anode and the cathode of thyristor Th1 is negative, thyristor Th1 then being off. When circuit 3 delivers a control signal to terminal 206, that is to say when a turn-on current, in the present example, positive, is delivered to the gate of triac Tr, the triac Tr turns on. As an example, to provide the turn-on current, terminal 300 of circuit 3 provides a positive voltage pulse referenced to terminal 202, this voltage pulse being transformed to a current pulse by a resistor (not shown) coupling terminal 300 to terminal 206. The turning-on of the triac Tr results in a positive current flowing through triac Tr, from terminal 202 towards terminals 204 and 208. Since the potential of node 100 is greater than the potential of node 102, diode D3 is reverse-biased and is off. The current flowing through triac Tr then flows through forward-biased diode D4, all the way to terminal 208. This positive current is thus supplied to the cathode gate of thyristor Th2, which switches to the on state.

When the potential of node 100 decreases and comes closer to the potential of node 102, to become equal to the potential of node 102, due to the fact that the voltage between nodes 100 and 102 becomes zero, thyristor Th2 and triac Tr switch to the off state.

To simplify the above description of the operation of bridge 1 and of device 2, the threshold voltages of the diodes, of the thyristors, and of the triac have been neglected. It will be within the abilities of those skilled in the art to deduce the operation of bridge 1 and of device 2 when these threshold voltages are taken into account.

Further, it will be within the abilities of those skilled in the art to determine the operation of bridge 1 and of device 2 in the case where the potential of node 102 is greater than that of node 100, this operation being symmetrical to that described hereabove in the case where the potential of node 100 is greater than that of node 102. In particular, in the case where the potential of node 102 is greater than that of node 100, diode D4 is reverse-biased and thyristor Th2 is off, due to the fact that its voltage $V_{AK2}$ is negative. Thus, when the control signal delivered by circuit 3 is received by terminal 206 of device 2 and triac Tr switches to the on state, the positive current which flows through triac Tr from terminal 202 is delivered to the cathode gate of thyristor Th1, which switches to the on state due to the fact that its voltage $V_{AK1}$ is positive.

It will also be within the abilities of those skilled in the art to select diodes D3 and D4 so that they have a sufficient breakdown voltage with respect to the amplitude of voltage $V_{AC}$ and/or to possible overvoltages between nodes 100 and 102, such overvoltages for example resulting from an electrostatic discharge between nodes 100 and 102.

An advantage of device 2 is that the switching of thyristor Th1, respectively Th2, is implemented in the first operating quadrant of thyristor Th1, respectively Th2.

An advantage of device 2 is that, when thyristor Th1, respectively Th2, is off because its voltage $V_{AK1}$, respectively $V_{AK2}$, is negative, due to the fact that diode D3, respectively D4, is off (reverse-biased), the leakage current flowing through the cathode gate of thyristor Th1, respectively Th2, is much lower, for example, at least 10 or 100 times lower, than the leakage current which might have flowed therethrough in the absence of diode D3, respectively D4, such a leakage current being then for example in the order of 100 µA.

An advantage of device 2 is that circuit 3 does not need to know the polarity of voltage $V_{AC}$, that is, whether the potential of node 100 is greater or smaller than that of node 102. Indeed, it is sufficient for circuit 3 to detect each zero crossing of voltage $V_{AC}$. After each detected zero crossing, circuit 3 then delivers a control signal to terminal 206 of device 2 and only the correct thyristor Th1 or Th2, that is, the thyristor Th1 or Th2 having a positive voltage, respectively $V_{AK1}$ or $V_{AK2}$, switches to the on state.

An advantage of device 2 is that thyristors Th1 and Th2 cannot be simultaneously on, even if the circuit 3 delivers a single control signal.

An advantage of device 2 is that control circuit 3 delivers a single control signal to control the two thyristors Th1 and Th2, which enables to use a single output terminal of circuit 3, for example, a microcontroller.

An advantage of device 2 is that it enables to use a control circuit 3 having a positive power supply Vcc capable of being obtained without using a charge pump or optocouplers.

An advantage of device 2 is that the circuit 3 positive power supply Vcc can be directly referenced to ground GND node 106.

An advantage of device 2 is that it is can be entirely manufactured in the form of an integrated circuit and, more generally, that it enables to form bridge 1 entirely in the form of an integrated circuit.

An advantage of device 2 is that triac Tr may be sized so that a positive current applied to its gate having a relatively low value, for example, smaller than or equal to approximately 0.1 A, or even than 10 mA, is sufficient to turn it on. This, for example, enables circuit 3 to be implemented by means of a microcontroller, knowing that a microcontroller can only deliver a current having a relatively low value.

An advantage of device 2 is that the threshold voltages of diodes D3 and D4 and of triac Tr have an influence on the control portion of thyristors Th1 and Th2, but not on the power portion of thyristors Th1 and Th2. In other words, device 2 enables to avoid using, in addition to threshold components Th1, Th2, D1, and D2, a threshold component which would be series-connected to thyristor Th1 in the branch of bridge 1 comprising thyristor Th1 or to thyristor Th2 in the branch of bridge 1 comprising thyristor Th2, which would have decreased the efficiency of bridge 1.

It could have been devised to invert the position of diode D1, respectively D2, with that of thyristor Th1, respectively Th2. However, to deliver a positive turn-on current to the gate of one or the other of thyristors Th1 and Th2 in order to turn on the thyristors in their first quadrant, a power source isolated, for example, by an isolation transformer or by an optocoupler, delivering a positive potential reference to node 112 of bridge 1, should then have been provided.

It could also have been devised to replace cathode-gate thyristors Th1 and Th2 with anode-gate thyristors controlled to be turned on in their first quadrant. However, it is not possible to manufacture in integrated form such anode-gate thyristors turned on in the first quadrant while, according to an embodiment, bridge 1 forms part of an integrated circuit.

Further, the replacing of cathode-gate thyristors Th1 and Th2 with anode-gate thyristors controlled to be turned on in their first quadrant would have required providing a source of a negative potential referenced with respect to the anode of the anode-gate thyristors, which is not desirable.

An embodiment of device 2 enabling to control the two thyristors Th1 and Th2 of bridge 1 has been described. In an alternative embodiment, not shown, device 2 comprises an additional triac, having its gate connected to terminal 206 of device 2, connected in series with an additional diode D4.

Figure 2:
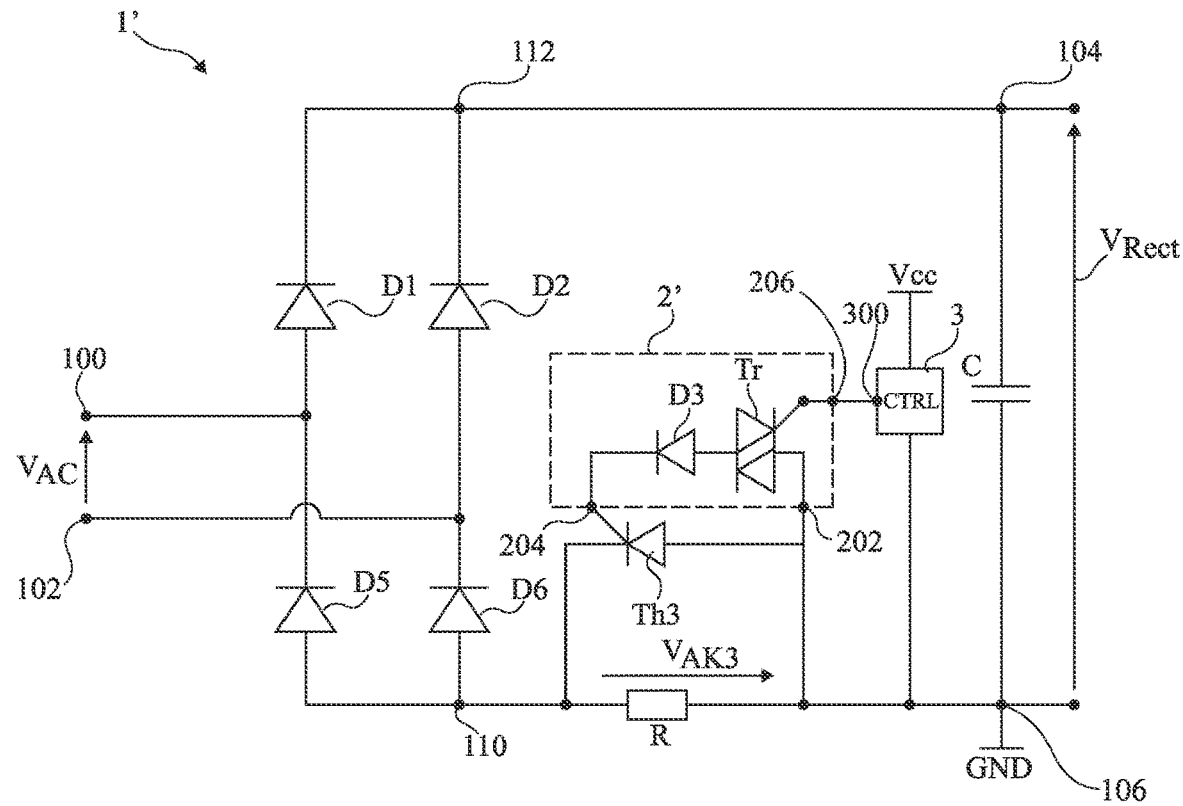
FIG. 2 shows, in the form of a circuit, another embodiment of a voltage rectifying bridge comprising a thyristor control device according to another embodiment.

FIG. 2 shows, in the form of a circuit, another embodiment of a voltage rectifying bridge 1' comprising a thyristor control device 2' according to another embodiment.

Only the differences between bridge 1 and bridge 1' and the differences between devices 2 and 2' are here highlighted.

Bridge 1' comprises, like bridge 1, two branches connected in parallel between nodes 110 and 112.

However, in this example, in the first branch of bridge 1', thyristor Th1 is replaced with a diode D5, diode D1 then being in series with diode D5. More particularly, the cathode of diode D5 is connected to node 100 and the anode of diode D5 is connected to node 110. Similarly, in the second branch of bridge 1', thyristors Th2 is replaced with a diode D6, diode D2 then being in series with diode D6. More particularly, the cathode of diode D6 is connected to node 102 and the anode of diode D6 is connected to node 110.

Bridge 1' differs from bridge 1 also in that node 110 is not connected to node 106. Indeed, in this embodiment, bridge 1' comprises a resistor R connected in parallel with a cathode-gate thyristor Th3, between nodes 110 and 106. The anode of thyristor Th3 is connected to node 106, the cathode of thyristor Th3 being connected to node 110.

Bridge 1' comprises the control device 2' of thyristor Th3, that is, device 2' is configured to control thyristor Th3. More exactly, device 2' is configured to receive a control signal and to generate another control signal from the received control signal, the control signal generated by device 2' being supplied to the cathode gate of thyristor Th3. In other words, device 2' is the driver of thyristor Th3.

Device 2' differs from device 2 (FIG. 1) in that it comprises neither diode D4, nor terminal 208. Indeed, in this embodiment, device 2' controls a single thyristor Th3, unlike device 2, which controls two thyristors Th1 and Th2.

Thus, like device 2, device 2' comprises: terminal 202 configured to be coupled to the anode of thyristor Th3, terminal 202 being connected to the anode of thyristor Th3 in FIG. 2; terminal 204 configured to be connected to the cathode gate of thyristor Th3; and terminal 206 configured to receive a control signal.

Device 2' comprises triac Tr and diode D3 series-connected between terminals 204 and 202 of device 2, the gate of triac Tr being connected to the terminal 206 of device 2. Diode D3 is configured to ensure the same function as in device 2.

In this example, the cathode of diode D3 is connected to terminal 204 and the anode of diode D3 is connected to a first conduction terminal of triac Tr, a second conduction terminal of triac Tr being connected to terminal 202. In another example, not shown, the anode of diode D3 is connected to terminal 202, and triac Tr is connected between the cathode of diode D3 and terminal 204.

As in FIG. 1, the terminal 206 of device 2' is connected to the terminal 300 of circuit 3, configured to deliver the control signal to the terminal 206 of device 2'. Further, circuit 3 is connected to the terminal 202 of device 2', that is, to the anode of thyristor Th3, and is configured to be electrically powered with power supply potential Vcc referenced to the potential of terminal 202.

Circuit 3 may form part of device 2' or be external to device 2' and, more generally, circuit 3 may form part of rectifying bridge 1' or be external to rectifying bridge 1'.

The parallel connection of thyristor Th3 and of resistor R forms a bypass circuit. This circuit enables, when capacitor C is discharged, to limit the inrush current by leaving thyristor Th3 in the off state. Thus, the capacitor charge is performed with time constant Rv*Cv, where Rv and Cv show the resistive and capacitive values of the respective components R and C. Once capacitor C is sufficiently charged, thyristor Th3 is switched to the on state to avoid possible phenomena of overheating of resistor R, causing a modification of bridge 1' and a decrease in its efficiency. Since the potential of node 106 is greater than the potential of node 110, that is, the voltage $V_{AK3}$ of thyristor Th3 is positive, the switching of thyristor Th3 to the on state results from the delivery, by circuit 3, of a control signal to terminal 206 of device 2', for example, a pulse of a positive potential referenced with respect to terminal 202. The delivery of the control signal to terminal 206 causes the turning on of triac Tr and the delivery of a positive current to the cathode gate of thyristor Th3 by device 2'.

According to an embodiment, device 2', or even the entire bridge 1', forms part of an integrated circuit.

Device 2' has the same advantages as those of device 2, except for the advantages linked to the simultaneous control of two thyristors.

The embodiments of FIGS. 1 and 2 may be combined, that is, a rectifying bridge comprising not only thyristors Th1 and Th2 with their control device 2, but also resistor R in parallel with thyristor Th3 controlled by device 2'.

Furthermore, the assembly of the bypass circuit and of the control device 2' can be associated to circuits other than a rectifying bridge, to limit the in-rush current of a capacitor.

Figure 3:
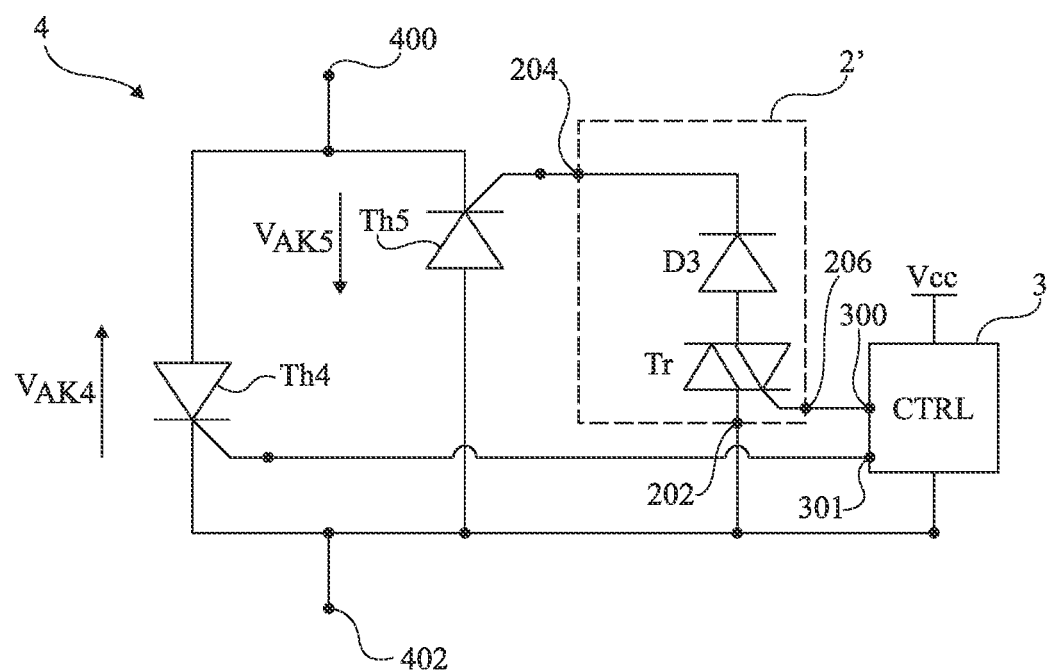
FIG. 3 shows, in the form of a circuit, an embodiment of a solid state relay comprising the control device of FIG. 2.

FIG. 3 shows, in the form of a circuit, an embodiment of a solid state relay 4 comprising the device 2' of FIG. 2.

Relay 4 comprises two terminals 400 and 402, and two cathode-gate thyristors Th4 and Th5, connected in antiparallel between terminals 400 and 402. In this example, the anode of thyristor Th4 is coupled, preferably connected, to terminal 400, the cathode of thyristor Th4 being coupled, preferably connected, to terminal 402 and, symmetrically, the anode of thyristor Th5 is coupled, preferably connected, to terminal 402, the cathode of thyristor Th4 being coupled, preferably connected, to terminal 400.

Relay 4 comprises the device 2' described in relation with FIG. 2. Terminal 204 is connected to the gate of thyristor Th5, terminal 202 being connected to the anode of thyristor Th5, that is, to terminal 402 in the example of FIG. 3.

Relay 4 also comprises circuit 3 having its terminal 300 connected to terminal 206 to deliver the control signal to device 2'. Further, circuit 3 is connected to the terminal 202 of device 2', that is, to the anode of thyristor Th5, and is configured to be electrically powered with power supply potential Vcc referenced with respect to the potential of terminal 202. By way of example, the potential Vcc is provided by a switching power supply comprising a galvanic isolation between its input and its output, such a power supply being commonly called flyback power supply. According to another example, the relay 4 belongs to an electronic device comprising a power factor correction (PFC) circuit, the potential Vcc being generated from an additional winding of the inductance of the PFC circuit. In case no isolation is required from control and line, the voltage Vcc can also be referenced on the line, and this makes for an even simpler solution.

According to an embodiment, circuit 3 is further configured to deliver a control signal to thyristor Th4. Circuit 3 then comprises a terminal 301 coupled, preferably connected, to the cathode gate of thyristor Th4.

In an embodiment, terminal 301 may be coupled to the gate of thyristor Th4 by a diode (optional) configured so that a positive current does not flow from terminal 301 to the gate of the thyristor when the diode is reverse-biased, that is, when the voltage $V_{AK4}$ of thyristor Th4 is negative. This diode then has its anode connected to terminal 301 of circuit 3. This diode enables to limit current leakages, via the gate of thyristor Th4, when voltage $V_{AK4}$ is negative. The diode would be necessary in case where nodes 300 and 301 are connected together.

Circuit 3 may form part of device 2' or be external to device 2' and, more generally, circuit 3 may form part of relay 4 or may be external to rectifier 4.

According to an embodiment, relay 4 forms part of an integrated circuit.

Relay 4 operates as follows. When the potential of terminal 402 is greater than that of terminal 400, the voltage $V_{AK5}$ of thyristor Th5 is positive and the voltage $V_{AK4}$ of thyristor Th4 is negative, thyristor Th4 being off. If circuit 3 delivers a control signal to terminal 206 of device 2', triac Tr turns on and a positive current is delivered to the gate of thyristor Th5, which turns on. When the potential of terminal 402 is smaller than that of terminal 400, the voltage $V_{AK4}$ of thyristor Th4 is positive and the voltage $V_{AK5}$ of thyristor Th5 is negative, thyristor Th5 being off. If circuit 3 delivers a control signal to the gate of thyristor Th4, thyristor Th4 turns on.

Although device 2' is used to control the thyristor Th5 of relay 4, rather than a thyristor of a voltage rectifying bridge such as for example the thyristor Th3 of the bypass circuit described in relation with FIG. 2, it has the same advantages than those of device 2.

Various embodiments and variants have been described. Those skilled in the art will understand that certain features of these various embodiments and variants may be combined, and other variants will occur to those skilled in the art. In particular, it will be within the abilities of those skilled in the art to replace the diodes D1 and D2 of bridge 1 with other threshold components such as transistors, thyristors, or triacs. In particular, it will be within the abilities of those skilled in the art to replace the diodes D1 and D2 of bridge 1' with other threshold components such as transistors, thyristors, or triacs.

Further, the use of a device 2 or 2' to control a thyristor is not limited to the case where the thyristor belongs to a lower half-bridge of a voltage rectifying bridge, to a voltage rectifying bridge bypass circuit, or to a solid state relay.

Finally, the practical implementation of the described embodiments and variations is within the abilities of those skilled in the art based on the functional indications given hereabove. In particular, it is within the abilities of those skilled in the art to select diodes D3 and D4 and/or triac Tr, particularly according to their threshold voltages and/or to their breakdown voltage.

The invention claimed is:

1. A control device for controlling a thyristor, comprising:
   a triac; and a first diode series-connected between the triac and a first terminal of the control device, wherein said first terminal is configured to be connected to a cathode gate of the thyristor; and wherein a second terminal of the control device is configured to be connected to an anode of the thyristor;

wherein the triac has a gate connected to a third terminal of the control device that is configured to receive a control signal.

2. The control device according to claim 1, wherein the first diode has a cathode directly connected to the first terminal of the control device.

3. The control device according to claim 2 further configured for controlling another thyristor, the control device further comprising:

a fourth terminal configured to be connected to a cathode gate of said another thyristor; and a second diode series-connected between the triac and the fourth terminal;

wherein the cathode of the second diode is directly connected to the fourth terminal of the control device; and wherein the second terminal of the control device is further configured to be connected to an anode of said another thyristor.

4. The control device according to claim 1, further comprising a circuit configured to deliver the control signal to the third terminal of the control device, the circuit being connected to the second terminal of the control device and being configured to be electrically powered with a power supply potential referenced to the second terminal of the control device.

5. An integrated circuit comprising the control device according to claim 1.

6. A rectifying bridge, comprising:

a first branch and a second branch connected in parallel between a first internal node of the rectifying bridge and a second internal node of the rectifying bridge;

wherein the first branch includes a first thyristor comprising a cathode connected to a first input node of the rectifying bridge, and an anode connected to the first internal node;

wherein the second branch includes a second thyristor comprising a cathode connected to a second input node of the rectifying bridge, and an anode connected to the first internal node; and a control device, comprising:

a triac; and a first diode series-connected between the triac and a first terminal of the control device, wherein the first terminal is configured to be connected to a cathode gate of the first thyristor;

wherein a second terminal of the control device is configured to be connected to anodes of the first thyristor and second thyristor and the first internal node;

wherein the triac has a gate connected to a third terminal of the control device that is configured to receive a control signal; and a second diode series-connected between the triac and a fourth terminal of the control device, wherein the fourth terminal is configured to be connected to a cathode gate of the second thyristor.

7. The rectifying bridge according to claim 6, further comprising a circuit configured to deliver the control signal to the third terminal of the control device, the circuit being connected to the first internal node of the rectifying bridge and being configured to be electrically power with a power supply potential referenced to the first internal node of the rectifying bridge.

8. The rectifying bridge according to claim 6:

wherein the first branch further includes a diode having a cathode connected to the second internal node and an anode connected to the first input node of the rectifying bridge; and wherein the second branch further includes another diode having a cathode connected to the second internal node and an anode connected to the second input node of the rectifying bridge.

9. An integrated circuit comprising the rectifying bridge according to claim 6.

10. A control device for controlling a thyristor, comprising:

a first terminal configured to be connected to a cathode gate of the thyristor;

a second terminal configured to be connected to an anode of the thyristor;

a third terminal configured to receive a control signal generated by a control circuit;

a triac having a first conduction terminal, a second conduction terminal directly connected to the second terminal, and a gate configured to receive a control signal; and a first diode having an anode directly connected to the first conduction terminal of the triac and a cathode directly connected to the first terminal.

11. The control device according to claim 10, further configured for controlling another thyristor, the control device further comprising:

a fourth terminal configured to be connected to a cathode gate of said another thyristor;

wherein the second terminal is further configured to be connected to an anode of the another thyristor; and a second diode having an anode directly connected to the first conduction terminal of the triac and a cathode directly connected to the fourth terminal.

12. The control device according to claim 10, wherein the control circuit is configured to be electrically powered with a power supply potential referenced to the second terminal of the control device.

13. An integrated circuit comprising the control device according to claim 10.

14. A rectifying bridge, comprising:

a first branch and a second branch connected in parallel between a first internal node of the rectifying bridge and a second internal node of the rectifying bridge;

wherein the first branch includes a first thyristor comprising a cathode connected to a first input node of the rectifying bridge, and an anode connected to the first internal node;

wherein the second branch includes a second thyristor comprising a cathode connected to a second input node of the rectifying bridge, and an anode connected to the first internal node; and a control device, comprising:

a first terminal directly connected to a cathode gate of the first thyristor;

a second terminal directly connected to the first internal node;

a third terminal configured to receive a control signal generated by a control circuit;

a fourth terminal directly connected to a cathode gate of the second thyristor;

a triac having a first conduction terminal, a second conduction terminal directly connected to the second terminal, and a gate configured to receive a control signal;

a first diode having an anode directly connected to the first conduction terminal of the triac and a cathode directly connected to the first terminal; and a second diode having an anode directly connected to the first conduction terminal of the triac and a cathode directly connected to the fourth terminal.

15. The rectifying bridge according to claim 14, wherein the control circuit is configured to be electrically power with a power supply potential referenced to the first internal node of the rectifying bridge.

16. The rectifying bridge according to claim 14:

wherein the first branch further includes a third diode having a cathode directly connected to the second internal node and an anode directly connected to the first input node of the rectifying bridge; and wherein the second branch further includes a fourth diode having a cathode directly connected to the second internal node and an anode directly connected to the second input node of the rectifying bridge.

17. An integrated circuit comprising the rectifying bridge according to claim 14.

* * * * *